(12) United States Patent
Trivedi et al.

(10) Patent No.: US 6,535,423 B2
(45) Date of Patent: Mar. 18, 2003

(54) DRAIN BIAS FOR NON-VOLATILE MEMORY

(75) Inventors: Ritesh Trivedi, Fair Oaks, CA (US);
Robert Baltar, Folsom, CA (US);
Mark Bauer, Placerville, CA (US);
Sandeep Guliani, Folsom, CA (US);
Balaji Srinivasan, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,370

(22) Filed: Dec. 29, 2000

(65) Prior Publication Data

US 2002/0085421 A1 Jul. 4, 2002

(51) Int. Cl.[7] ................................................. G11C 7/00
(52) U.S. Cl. ............................. 365/185.18; 365/185.2; 365/185.21; 365/185.24
(58) Field of Search ..................... 365/185.01, 185.18, 365/185.2, 185.21, 185.24

(56) References Cited

U.S. PATENT DOCUMENTS

| | | | |
|---|---|---|---|
| 4,742,292 A | | 5/1988 | Hoffman |
| 4,763,026 A | * | 8/1988 | Tsen et al. ................... 307/530 |
| 5,423,047 A | | 6/1995 | Leak |
| 5,508,958 A | * | 4/1996 | Fazio et al. ............. 365/185.19 |
| 5,539,690 A | * | 7/1996 | Talreja et al. .......... 365/185.22 |
| 5,594,360 A | * | 1/1997 | Wojciechowski ........... 324/771 |
| 5,608,669 A | | 3/1997 | Mi |
| 5,642,308 A | | 6/1997 | Yoshida |
| 5,671,179 A | * | 9/1997 | Javaniford ............. 365/185.33 |
| 5,748,546 A | * | 5/1998 | Bauer et al. ................. 365/210 |
| 5,793,671 A | * | 8/1998 | Selcuk ........................ 365/154 |
| 5,821,806 A | * | 10/1998 | Pascucci ..................... 327/538 |
| 5,828,616 A | * | 10/1998 | Bauer et al. ................. 365/210 |
| 5,859,798 A | | 1/1999 | Yero |
| 5,912,838 A | * | 6/1999 | Chevalier ............... 365/185.03 |
| 5,969,986 A | | 10/1999 | Wong et al. |
| 5,986,937 A | | 11/1999 | Yero |
| 6,034,888 A | | 3/2000 | Pasotti et al. |
| 6,097,633 A | | 8/2000 | La Placa |
| 6,141,252 A | * | 10/2000 | Chen ..................... 365/185.18 |
| 6,151,271 A | | 11/2000 | Lee |
| 6,240,040 B1 | | 5/2001 | Akaogi et al. |
| 6,260,103 B1 | | 7/2001 | Alexis et al. |
| 6,269,040 B1 | | 7/2001 | Reohr et al. |
| 6,310,805 B1 | | 10/2001 | Kasa et al. |
| 6,320,808 B1 | | 11/2001 | Conte et al. |
| 6,330,186 B2 | | 12/2001 | Tanaka |

FOREIGN PATENT DOCUMENTS

JP        406187074 A   *   7/1994

* cited by examiner

*Primary Examiner*—Viet Q. Nguyen
(74) *Attorney, Agent, or Firm*—Blakely, Sokoloff, Taylor & Zafman LLP

(57) ABSTRACT

An apparatus and method are disclosed for providing drain bias for non-volatile memory. According to one embodiment, the drain bias is provided utilizing a drain bias circuit that is referenced by a static voltage reference.

35 Claims, 7 Drawing Sheets

Flash Memory Sensing Block Diagram

Sample and Hold Reference Generator

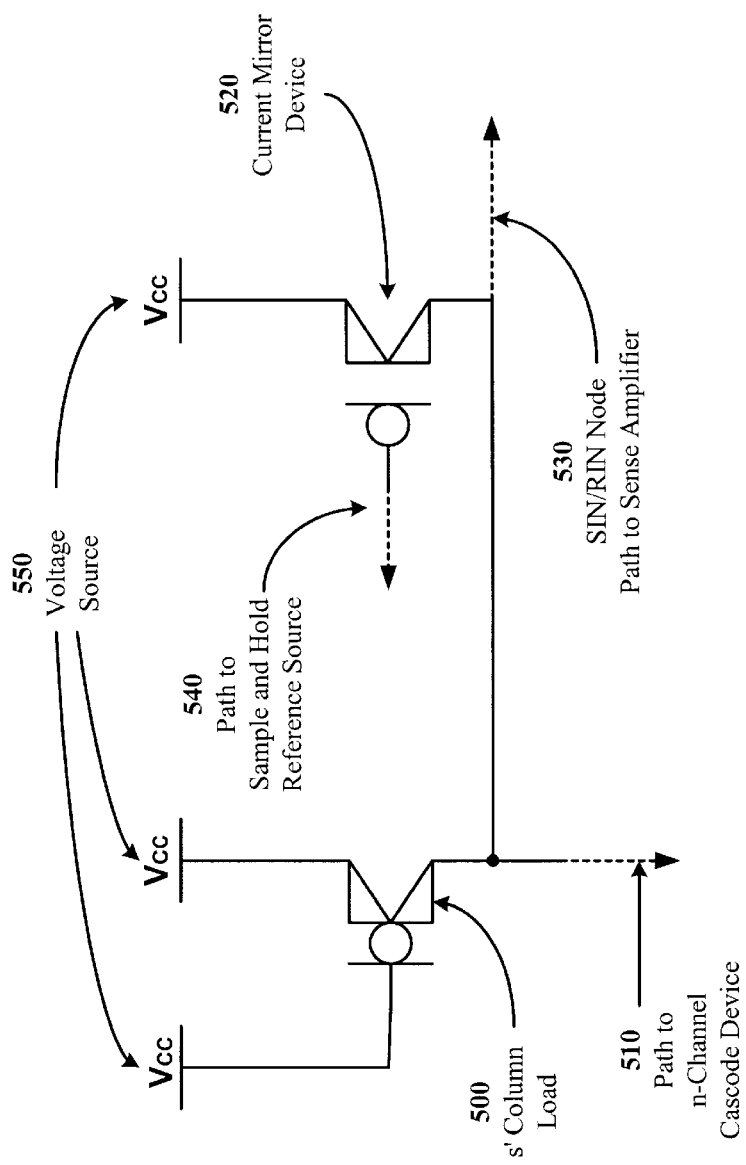

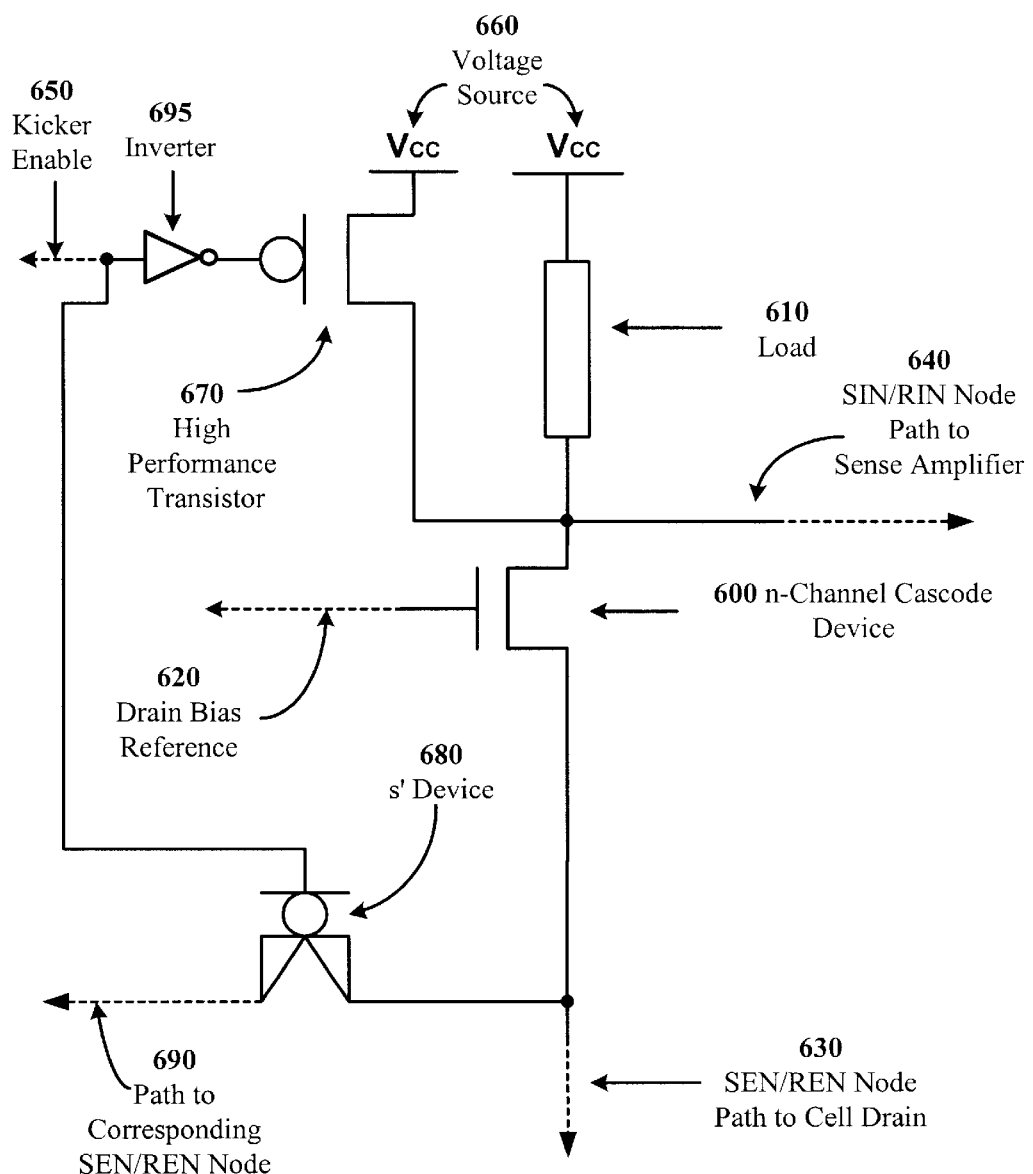
Figure 6 — Drain Bias Kicker Circuit

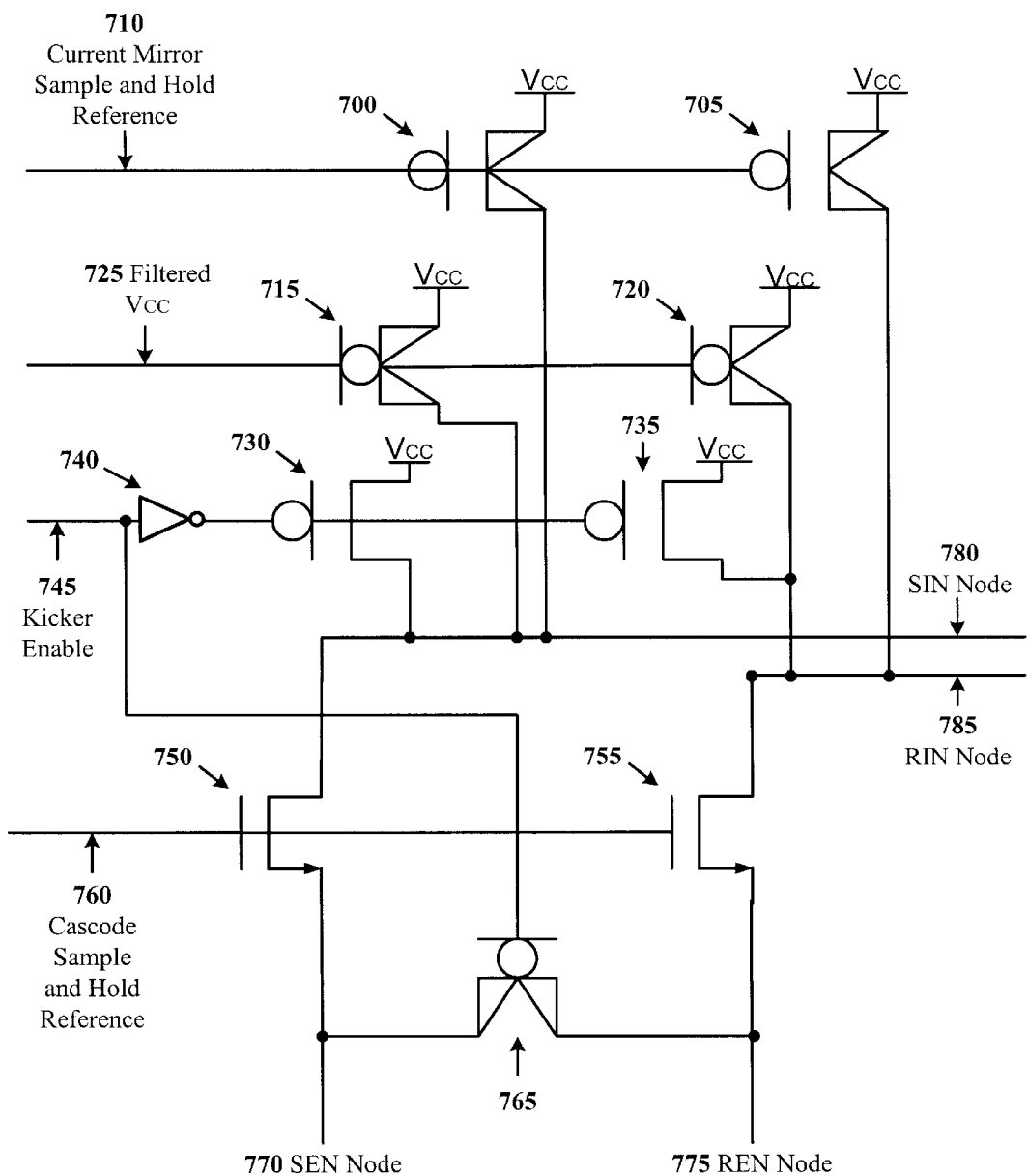

DRAIN BIAS FOR NON-VOLATILE MEMORY

FIELD OF THE INVENTION

This invention relates to computer memory in general, and more specifically to providing drain bias for non-volatile memory.

BACKGROUND OF THE INVENTION

Non-volatile memory that can retain information when a power supply is switched off, such as flash memory, is being used increasingly in electronic devices for personal and commercial use, including cellular telephones, digital cameras, embedded devices, and personal data assistants. Flash memory is well suited for such uses because it is electrically erasable and can be reprogrammed within normal circuit parameters, without requiring special programming devices operating at higher than normal voltage levels.

Technology has made it possible to produce flash memory that is increasingly dense, resulting in greater and greater amounts of memory being available to electronic products. However, increasing the density of memory results in increased power consumption. Further, in order to reduce the power consumption of these products, there has also been an attempt to operate flash memory at lower voltages and to utilize low power circuits, which presents additional challenges to keep up with performance demand and cost restraints.

Flash memory is composed of flash cells that require a certain drain voltage for proper operation. The function of a drain bias circuit is to provide the necessary drain voltage to a flash cell. The load in a drain bias converts the current differential between the data flash cell and the reference cell to a voltage differential at the data array sense input node (SIN node) or reference array input node (RIN node) for the sense amplifier to sense. In 1:1 sensing operation, for each sense amplifier there is one drain bias circuit provided for the array side and one provided for the reference side. When there is no sensing operation, the drain bias circuit may be turned off and thus does not sink any current. Before sensing operations commence, it is necessary to turn the drain bias on, and thereby cause current flow. When turned on, the drain bias circuit begins charging the bitline or column, and in addition begins to develop the voltage margin that the sensing amplifier will be sensing. It is important to charge the bitline quickly in order to achieve sufficiently fast sensing speed.

A typical drain biasing circuit may include a biasing feedback inverter. As the data size (the number of bits being read at one time) and density of non-volatile memory are increased, a drain bias circuit with a biasing feedback inverter may pose difficulties because the biasing feedback inverter sinks a relatively high amount of current. The current for each such circuit may be in the range of 100 to 200 microamps. As more flash memory cells are read simultaneously, the resulting power consumption also rises. In addition, the physical area occupied by such a drain bias circuit needs to be relatively large for sufficient speed of operation.

The development of non-volatile memory has moved towards reading more memory cells simultaneously, thus requiring additional sensing amplifiers and drain bias circuits. As more drain bias circuits are required for sensing more memory cells, the physical space in a semiconductor device that is dedicated to this function also increases. For example, in x64 sensing, in which the values of 64 memory cells are read at a time, there are 128 drain bias circuits, resulting in significant current drain and physical space requirements. As the physical area for drain bias circuits increases, the parasitic capacitance created generally will also increase, and this capacitance creates power losses in the memory device.

In addition to non-volatile memory moving towards larger scale devices, the device supply voltages levels have also been reduced to save power in operation and extend the life of power sources. As non-volatile memory moves to these lower supply voltages, it becomes more difficult to bring voltages up to necessary operating levels quickly so as not to sacrifice speed of memory operation.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIG. 5 illustrates a drain bias current mirror and column load with a sample and hold reference source;

FIG. 6 illustrates a drain bias kicker circuit; and

FIG. 7 contains a circuit diagram illustrating the connection of a drain bias circuit pair to the drain bias load, drain bias kicker, and reference generator.

DETAILED DESCRIPTION

A method and apparatus are described for providing drain bias for non-volatile memory.

In the following description, for the purposes of explanation, numerous specific details are set forth in order to provide a thorough understanding of the present invention. However, it will be apparent to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

Figure 1:
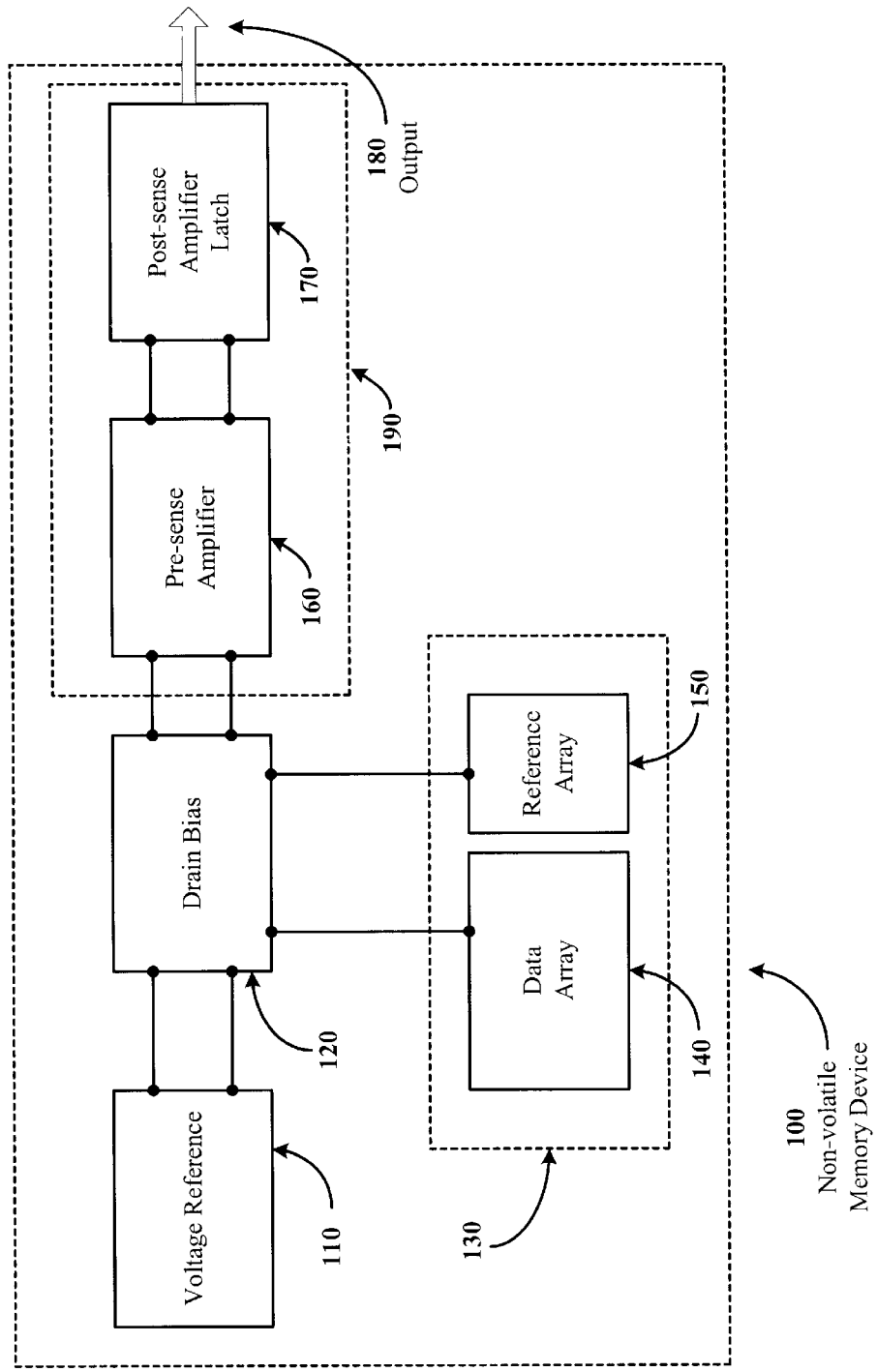
FIG. 1 is a block diagram illustrating an embodiment of a non-volatile memory sensing apparatus.

FIG. 1 is a block diagram that illustrates the elements that are involved in sensing the contents of non-volatile memory under a particular embodiment. Non-volatile memory device 100 includes a voltage reference 110. Voltage reference 110 is connected to drain bias 120, which maintains the necessary voltage levels for non-volatile memory cells. In this embodiment, the memory cells are included within memory 130, which includes data array 140 and reference array 150. From drain bias 120, memory cell signals are transferred to pre-sense amplifier 160, which provides data to post-sense amplifier latch 170. Pre-sense amplifier 160 and post-sense amplifier latch 170 are included within sense amplifier 190. Data is transferred from post-sense latch 170 to memory device output 180.

Static Reference Drain Bias

Figure 2:
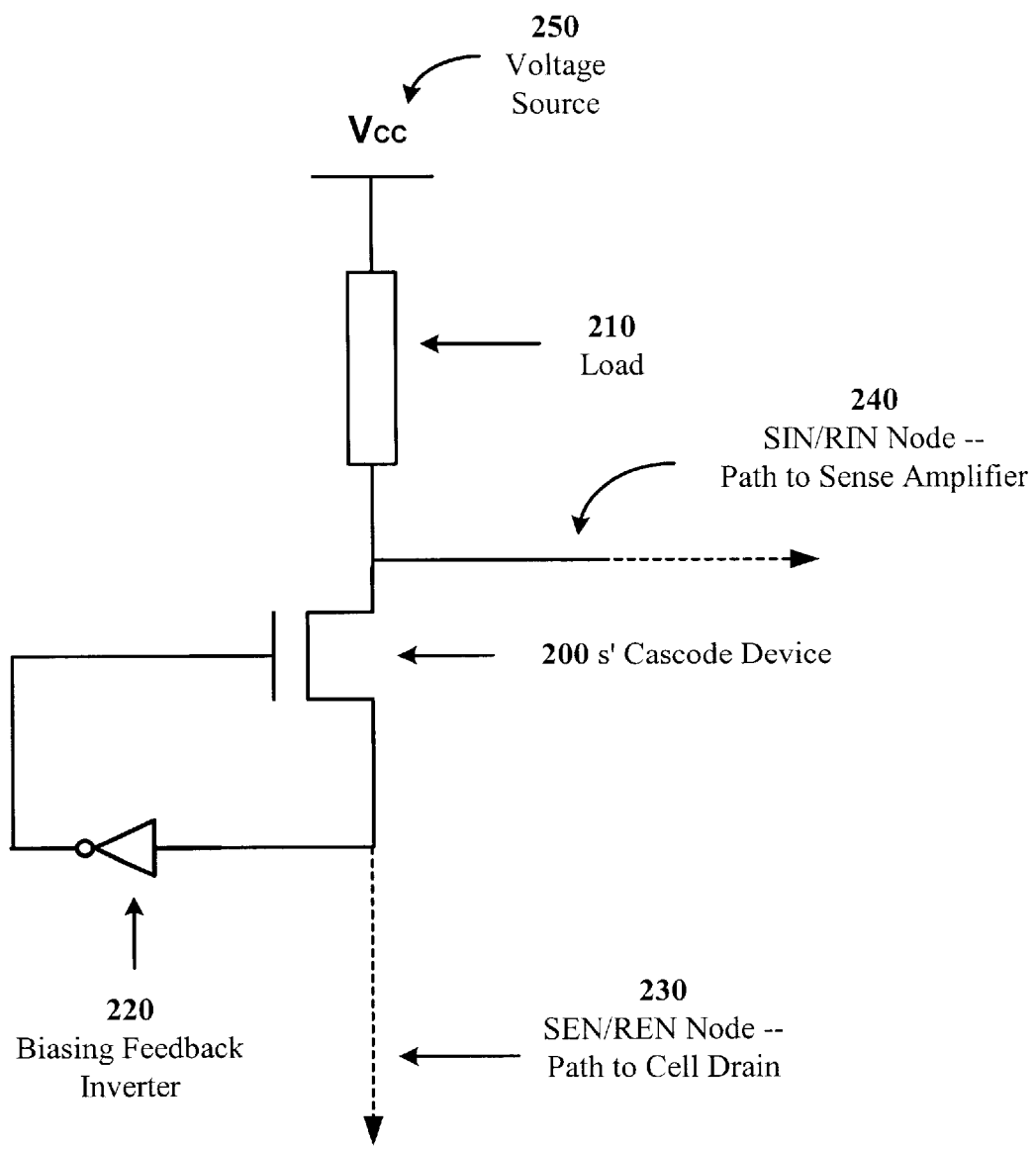
FIG. 2 is an illustration of a typical drain bias circuit for non-volatile memory including a biasing feedback inverter.

Previously, a drain bias circuit for flash memory typically was a feedback cascode drain bias utilizing an s' cascode device. (An s' device is a low threshold voltage n-channel device.) A conventional feedback cascode drain bias circuit is shown in FIG. 2. In FIG. 2, the gate of s' cascode device 200 is controlled by biasing feedback inverter 220. The feedback to the gate of s' cascode device 200 is controlled by the cell drain voltage from sense node or reference node, SEN/REN 230, if the drain reference is for the data array or the reference array, respectively. Connected to s' cascode device 200 is drain bias load 210. In this example, between drain bias load 210 and s' cascode device 200 is either the sense input node or the reference input node, SIN/RIN 240, depending on whether the drain bias circuit is connected to a data array cell or to a reference array cell. The other side of drain bias load 210 is connected to source voltage $V_{CC}$ 250.

Figure 3:
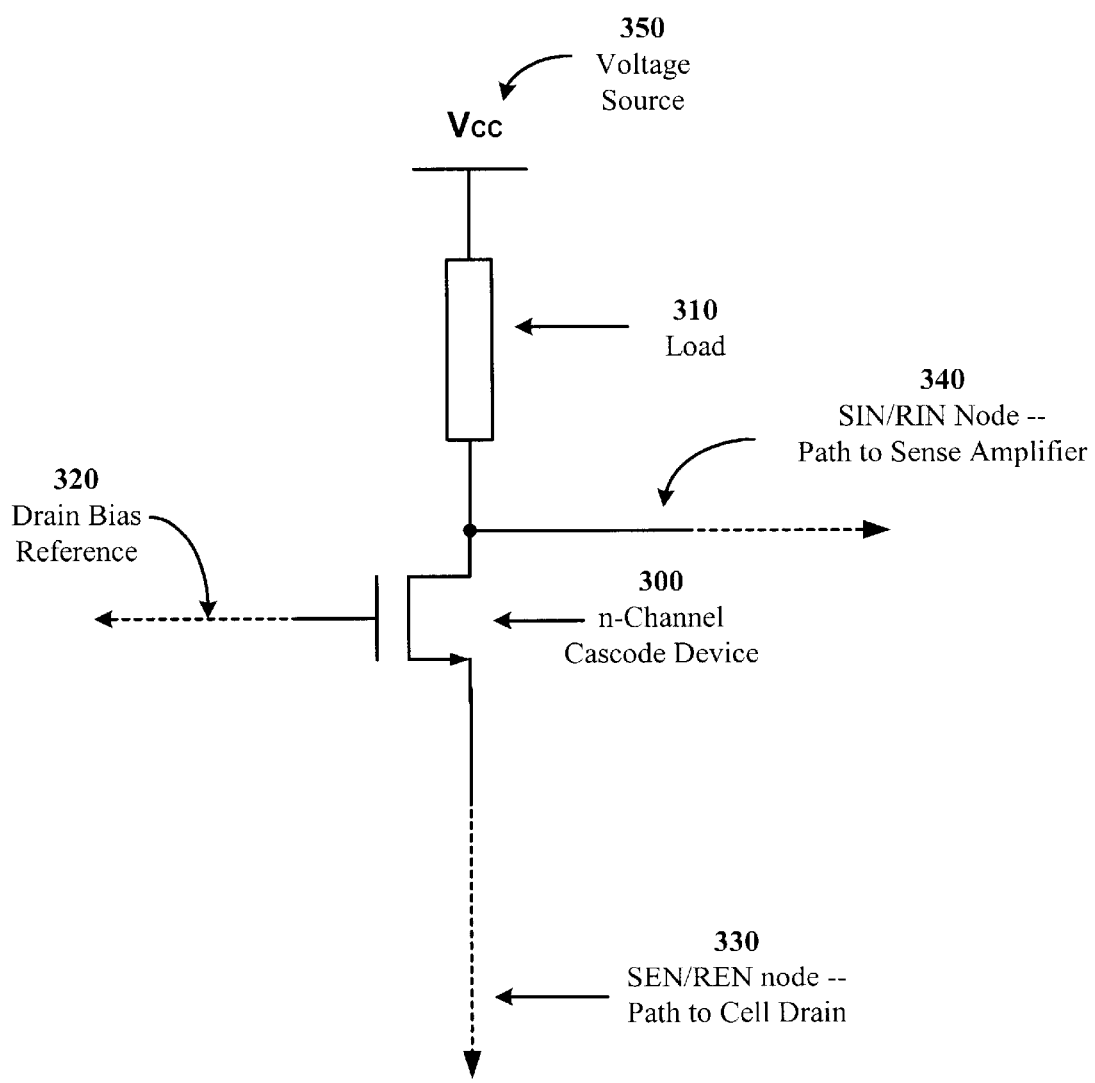
FIG. 3 is an illustration of a static cascode drain bias circuit.

In a particular embodiment, a drain bias circuit is as shown in FIG. 3. This novel device is referred to as a static cascode drain bias. The voltage reference source connected to the gate of the cascode device is a static voltage reference that does not employ a feedback inverter. In this embodiment, an n-channel cascode device 300 is used, instead of an s' cascode device 200 as shown in FIG. 2. The use of an n-channel device may reduce the capacitance related to the reference signal because an n-channel device may be physically smaller than an s' device. In FIG. 3, the gate of n-channel cascode device 300 is connected to drain bias reference 320. In one embodiment, the drain bias reference is the sample and hold reference generator shown in FIG. 4 and described below. One terminal of n-channel cascode device 300 is connected to SEN/REN 330, which is the path to the memory cell drain, and the other terminal is connected to load 310. Between n-channel cascode device 300 and load 310 is either the sense input node or the reference input node, SIN/RIN 340, depending on whether the drain bias circuit is connected to a data array cell or to a reference array cell. In one embodiment, load 310 is the drain bias column load and current mirror shown in FIG. 5 and described below. The other side of the load is connected to $V_{CC}$, voltage source 350. In one embodiment, sense input node or reference input node SIN/RIN 340 is also connected to the drain bias kicker circuit illustrated in FIG. 6 and described below.

The embodiment shown in FIG. 3 provides for a decrease in current and power consumption by the drain bias circuit. The embodiment does not require a feedback inverter and as a result the current drain associated with the drain bias function is reduced as compared with typical designs. As the number of cells of a non-volatile memory device that are read simultaneously in a single operation is increased, the power savings for the memory device become increasingly significant.

Further, the device utilizes an n-channel cascode device, thereby using a device with a higher Beta value. In this embodiment, it is possible to utilize an n-channel cascode device that is smaller than an s' cascode device, which reduces the physical area required on a memory device chip and reduces the resulting parasitic capacitance. The reduction in capacitance lowers the power requirements for the memory device. The n-channel device requires a higher gate voltage than is required for an s' device, and such gate voltage is supplied by the drain bias voltage reference. The embodiment shown in FIG. 3 has small sense node capacitance, which allows for high performance operation with low power consumption.

Sample and Hold Reference Generator

For operation of the embodiment illustrated in FIG. 3, a drain bias voltage reference may be included. The drain bias shown in FIG. 2 typically would include a reference voltage for the feedback biasing, but this does not require a special voltage, as the voltage source $V_{CC}$ may be used as the reference source for such a circuit. However, for the embodiment shown in FIG. 3, a special drain bias circuit may be used to provide the necessary gate voltage.

Figure 4:
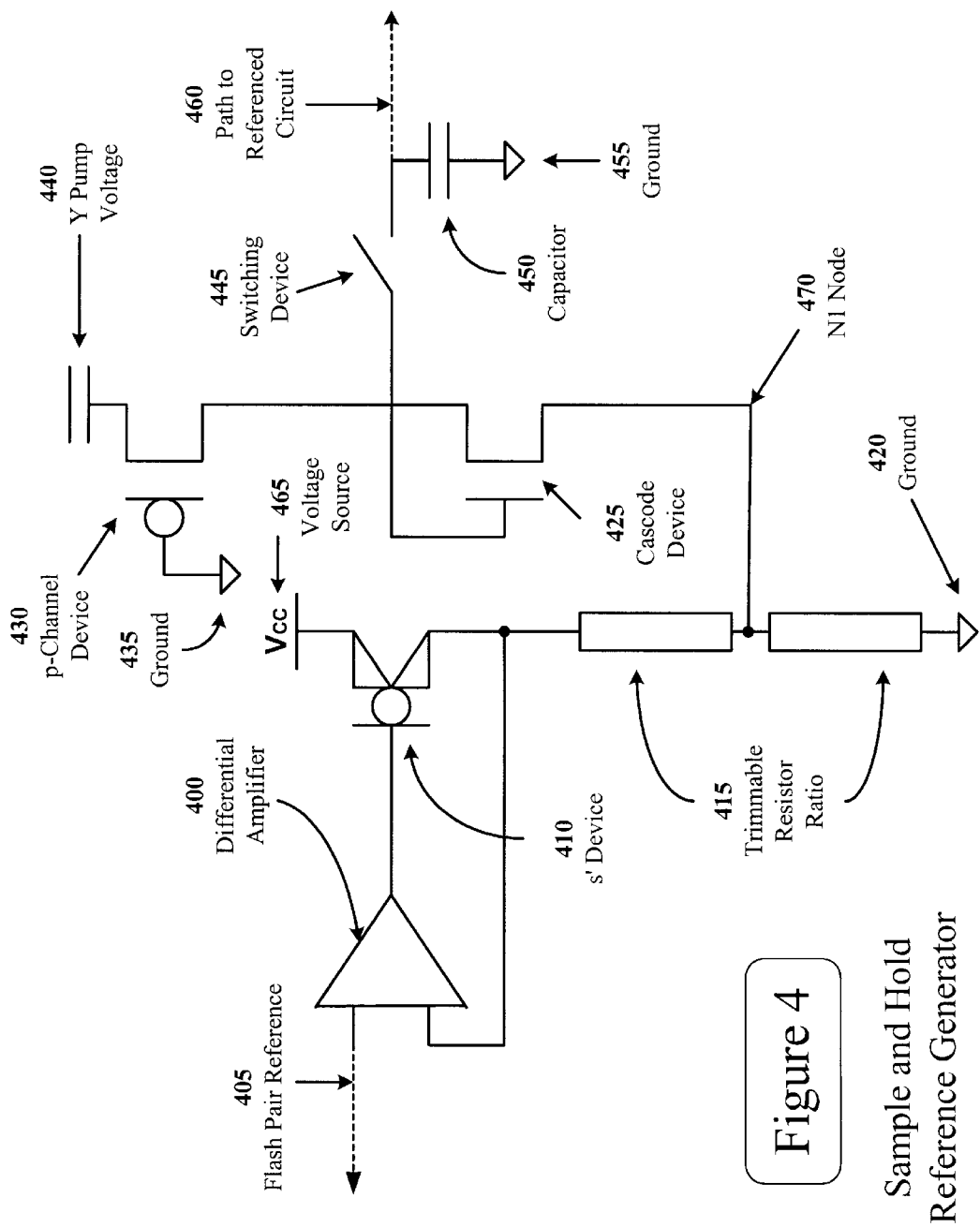
FIG. 4 illustrates a sample and hold reference generator.

FIG. 4 illustrates a sample and hold reference generator under a particular embodiment. In the circuit, the output of differential amplifier 400 is connected to the gate of s' device 410. The inputs to differential amplifier 400 are flash pair reference 405 and one terminal of s' device 410. The flash pair reference 405 is a relatively stable voltage that differential amplifier 400 utilizes to regulate the source of s' device 410. Resistor ratio 415 is trimmable to provide the desired bit line voltage at node N1 470. Node N1 470 then connects to the drain of cascode device 425. Cascode device 425 is an n-channel device that is matched to the n-channel cascode device in the drain bias circuit to which the sample and hold reference generator is connected. In one embodiment in which the reference source in FIG. 4 provides the voltage reference for the static reference drain bias circuit illustrated in FIG. 3, cascode device 425 is matched to n-channel cascode device 300. The source of cascode device 425 is connected to one terminal of p-channel device 430. The gate of p-channel device 430 is connected to round 435. The second terminal of device 430 is connected to Y pump voltage 440. (The voltage pump device is not shown.) In one embodiment, the voltage pump device raises the voltage above the level of the voltage source, which is useful when the source voltage for a non-volatile memory device is lowered to levels such as 1.8 volts. The reference voltage obtained from the gate of cascode device 425 is connected to one terminal of switching device 445. The second terminal of switching device 445 is connected to capacitor 450, which is then connected to ground 455. Switching device 445 is a switch that is controlled by a pulse source and that periodically closes the connection between the gate of cascode device 425 and capacitor 450. Upon closing switching device 445, capacitor 450 is charged to the reference voltage. In one embodiment, the reference voltage is provided by capacitor 450 to a drain bias circuit via path 460.

In a particular embodiment, the sample and hold reference generator shown in FIG. 4 is the sole voltage reference for all read drain bias circuits in a non-volatile memory device. In a device in which a large number of memory cells are sensed simultaneously, the reference generator drives many transistors, and such transistors have a very large total capacitance. If the reference generator is powered up every time a read is executed, there is a large power cost. In this embodiment, the reference generator is powered up during the power up sequence for the memory device. Because of the sample and hold function, the reference circuit does not require power with every memory access, but rather only requires periodic refresh operation to charge capacitor 450 to the required reference voltage.

The reference generator consumes very little power because it is the sole reference source for the device and because power operation is only necessary periodically. Instead, the circuit utilizes a large capacitance and from time to time charges up the capacitance by opening up the switch. In addition, the circuit provides $V_t$ (threshold voltage) compensation across wide ranges of temperature and varying $V_{CC}$ to make $V_t$ largely independent of cascode characteristics.

Current Mirror and Column Load

In a certain embodiment, a circuit comprising a column load and a current mirror is used as a load for a non-volatile memory drain bias. In such a circuit, the column load acts as a resistance in the circuit, and is a standard device to reduce the area required for a resistance in a semiconductor device. The current mirror device provides a common mode current to the memory array. Sensing of flash memory is accomplished through voltage sensing, which is a sensing of the current multiplied times the resistance (the IR drop). The circuit samples or mirrors out part of the current. The common mode current is taken out of the reference and array side, and such action raises SIN/RIN levels and provides a bigger $V_{ds}$ (the voltage between drain and source) to the cascode device. The higher voltage assists in keeping the cascode device in saturation at low $V_{CC}$.

However, a drain bias load including a current mirror can be a source of significant power loss because of the reference source. FIG. 5 illustrates an embodiment in which the reference is a sample and hold reference source that results in significant power savings. The load illustrated in FIG. 5 includes an s' column load device 500 with gate and one terminal of such device connected to voltage source $V_{CC}$ 550. The second terminal of s' column load device 500 is connected to either the sense input node or reference input node, SIN/RIN 530, if the drain bias is for a memory cell in a data array or in a reference array, respectively. Such SIN/RIN node 530 is the input to the sense amplifier and is connected to the drain of an n-channel cascode device. (The sense amplifier and the n-channel cascode device are not shown in FIG. 5.)

In one embodiment, the n-channel cascode device connected at path 510 is device 300 shown in FIG. 3 and the sense amplifier is sense amplifier 190 shown in FIG. 1. Also connected to RIN/SIN 530 is one terminal of current mirror device 520. The second terminal of current mirror device 520 is attached to voltage source $V_{CC}$ 550, while the gate is connected to a path to sample and hold current mirror reference 540. In a further embodiment, the sample and hold reference source is shown in FIG. 4. As described above, a sample and hold reference source results in a significant power savings over typical voltage references. The drain bias load thus results in lower power operating for the drain bias circuit.

Kicker for SIN/RIN Nodes

In one embodiment, a drain bias kicker circuit is connected to the SIN/RIN node of a drain bias circuit. A drain bias kicker circuit is shown in FIG. 6. Such a kicker circuit is connected to the drain bias on both the data array and reference array sides. As illustrated in FIG. 6, one terminal of high performance transistor 670 is connected to the SIN/RIN node 640. According to one embodiment, high performance transistor 670 is a p-channel device. The second terminal of high performance transistor 670 is connected to voltage source $V_{CC}$ 660, while the gate of high performance transistor 670 is connected to kicker enable 650 through inverter 695. The source of the kicker enable is not shown and may be a known pulse generating source. Also connected to SIN/RIN node 640 is n-channel cascode device 600 and drain bias load 610.

In this embodiment, kicker enable 650 activates p-channel device 670 through inverter 695 and provides a path from voltage source $V_{CC}$ 660 to SIN/RIN node 640. At the beginning of each memory access, the kicker pulse turns high performance transistor 670 on, thereby pulling SIN/RIN node 640 to the level of voltage source $V_{CC}$ 660 and pulling the SEN/REN node to the level of the source voltage minus the voltage across the n-channel cascode device, or $V_{CC} - V_{tcas}$. When enabled, the kicker circuit acts as a temporary low resistance path to charge up the bit line. In one embodiment, kicker circuits pull both the SIN node and RIN node to $V_{CC}$ before starting the sensing process, thereby equalizing the potential for the sense and reference sides. Bringing the sense and reference sides to the same potential then allows the differential voltage used for memory cell sensing to be developed more quickly, thus increasing operational speed.

In one embodiment, the SEN/REN node 630 is shorted to the matching sense or reference node for the corresponding data or reference drain bias circuit using s' device 680. S' device 680 is activated by kicker enable 650, and activating the device has the effect of equalizing the sense and reference nodes during bit line charging. This assists in accelerating sensing time when there is a mismatch between the capacitance of the main data array and the capacitance of the mini reference array in a memory device.

Drain Bias Pair Circuit

FIG. 7 illustrates one embodiment in which a drain bias circuit pair is shown together with embodiments of kicker circuits, current mirror and column loads, and sample and hold voltage references.

In one embodiment, the gates of current mirrors 700 and 705 are connected to sample and hold voltage reference 710. The gates of column loads 715 and 720 are connected to filtered voltage source $V_{CC}$ 725. The gates of high performance transistors 730 and 735 are connected to kicker enable 745 through inverter 740. N-channel cascode devices 750 and 755 are connected to sample and hold voltage reference 760. SEN node 770 and REN node 775 are equalized by s' device 765, which is enabled by kicker enable 745. The current mirrors, column loads, p-channel devices, and n-channel cascode devices for the data array and reference array sides are connected respectively to SIN node 780 and RIN node 785.

What is claimed is:

1. A method comprising:
   biasing a cell drain for a first non-volatile memory cell using a first drain bias circuit, said first drain bias circuit comprising an n-channel cascode amplifier; and
   referencing said first drain bias circuit with a static voltage reference.

2. The method of claim 1, wherein said static voltage reference is a sample and hold voltage reference.

3. The method of claim 1, wherein said static voltage reference is a voltage reference for a plurality of drain bias circuits.

4. The method of claim 3, wherein said static voltage reference is a voltage reference for all drain bias circuits in a non-volatile memory device.

5. The method of claim 1, further comprising biasing a cell drain for a second non-volatile memory cell using a second drain bias circuit, wherein:
   said first memory cell is in a data array, and
   said second memory cell is in a reference array.

6. A method comprising:
   biasing a cell drain for a first non-volatile memory cell using a first drain bias circuit; and
   referencing said first drain bias circuit with a static voltage reference, said static voltage reference being a sample and hold voltage reference.

7. The method of claim 6, wherein said static voltage reference is a voltage reference for a plurality of drain bias circuits.

8. The method of claim 7, wherein said static voltage reference is a voltage reference for all drain bias circuits in a non-volatile memory device.

9. The method of claim 6, further comprising biasing a cell drain for a second non-volatile memory cell using a second drain bias circuit, wherein:
   said first memory cell is in a data array, and
   said second memory cell is in a reference array.

10. A drain bias circuit for a non-volatile memory cell comprising:
    a semiconductor device; and
    a reference connection for said semiconductor device, wherein said reference connection provides a static voltage reference to said semiconductor device, said semiconductor device being an n-channel cascode amplifier.

11. The drain bias circuit for a non-volatile memory cell of claim 10, wherein said non-volatile memory cell is a flash memory cell.

12. The drain bias circuit for a non-volatile memory cell of claim 10, wherein said static voltage reference is a sample and hold voltage reference.

13. The drain bias circuit for a non-volatile memory cell of claim 10, wherein said static voltage reference is a voltage reference for a plurality of drain bias circuits.

14. The drain bias circuit for a non-volatile memory cell of claim 12, wherein said static voltage reference is a voltage reference for all drain bias circuits in a non-volatile memory device.

15. The drain bias circuit for a non-volatile memory cell of claim 10, wherein said drain bias circuit biases a cell drain for a non-volatile memory cell in a data array and wherein a second drain circuit biases a cell drain for a non-volatile memory cell in a reference array.

16. A drain bias circuit for a non-volatile memory cell comprising:
    a semiconductor device; and
    a reference connection for said semiconductor device, wherein said reference connection provides a static voltage reference to said semiconductor device, said static voltage reference being a sample a nd hold voltage reference.

17. The drain bias circuit for a non-volatile memory cell of claim 16, wherein said non-volatile memory cell is a flash memory cell.

18. The drain bias circuit for a non-volatile memory cell of claim 16, wherein said static voltage reference is a voltage reference for a plurality of drain bias circuits.

19. The drain bias circuit for a non-volatile memory cell of claim 18, wherein said static voltage reference is a voltage reference for all drain bias circuits in a non-volatile memory device.

20. The drain bias circuit for a non-volatile memory cell of claim 16, wherein said drain bias circuit biases a cell drain for a non-volatile memory cell in a data array and wherein a second drain circuit biases a cell drain for a non-volatile memory cell in a reference array.

21. A non-volatile memory device, comprising:
    a first memory cell; and
    a first drain bias circuit for said memory cell, wherein said first drain bias circuit provides drain bias for said first memory cell and wherein said first drain bias circuit is referenced by a static voltage reference, said first drain bias circuit comprising an n-channel cascode amplifier.

22. The non-volatile memory device of claim 21, wherein said first memory cell is a flash memory cell.

23. The non-volatile memory device of claim 21, wherein said static voltage reference is a sample and hold voltage reference.

24. The non-volatile memory device of claim 23, wherein said static voltage reference is a voltage reference for a plurality of drain bias circuits.

25. The non-volatile memory device of claim 24, wherein said static voltage reference is a voltage reference for all drain bias circuits in said non-volatile memory device.

26. The non-volatile memory device of claim 21, further comprising
    a second drain bias circuit, wherein:
        said first memory cell is in a data array, and
        said second drain circuit biases a second memory cell in a reference array.

27. A non-volatile memory device, comprising:
    a first memory cell; and
    a first drain bias circuit for said memory cell, wherein said first drain bias circuit provides drain bias for said first memory cell and wherein said first drain bias circuit is referenced by a static voltage reference, said static voltage reference being a sample and hold voltage reference.

28. The non-volatile memory device of claim 27, wherein said first memory cell is a flash memory cell.

29. The non-volatile memory device of claim 27, wherein said static voltage reference is a voltage reference for a plurality of drain bias circuits.

30. The non-volatile memory device of claim 29, wherein said static voltage reference is a voltage reference for all drain bias circuits in said non-volatile memory device.

31. The non-volatile memory device of claim 27, further comprising a second drain bias circuit, wherein:

said first memory cell is in a data array, and said second drain circuit biases a second memory cell in a reference array.

32. A method comprising:

biasing a cell drain for a first non-volatile memory cell using a first drain bias circuit, said first non-volatile memory cell being a flash memory cell and said first drain bias circuit comprising an n-channel cascode amplifier; and referencing said first drain bias circuit with a static voltage reference.

33. A method comprising:

biasing a cell drain for a first non-volatile memory cell using a first drain bias circuit, said first non-volatile memory cell being a flash memory cell; and referencing said first drain bias circuit with a static voltage reference, said static voltage reference being a sample and hold voltage reference.

34. The method of claim 33, wherein said static voltage reference is a voltage reference for a plurality of drain bias circuits.

35. The method of claim 34, wherein said static voltage reference is a voltage reference for all drain bias circuits in a non-volatile memory device.

* * * * *